US008890850B2

(12) United States Patent
Chung et al.

(10) Patent No.: US 8,890,850 B2
(45) Date of Patent: Nov. 18, 2014

(54) ORGANIC LIGHT-EMITTING DIODE PANEL AND TOUCH-SCREEN SYSTEM INCLUDING THE SAME

(75) Inventors: In Jae Chung, Gyeonggi-do (KR); In Ho Ahn, Gyeonggi-do (KR); Seong Ho Baik, Gyeonggi-do (KR); Sang Hyuck Bae, Seoul (KR)

(73) Assignee: LG Display Co., Ltd., Seoul (KR)

( * ) Notice: Subject to any disclaimer, the term of this patent is extended or adjusted under 35 U.S.C. 154(b) by 2099 days.

(21) Appl. No.: 11/826,148

(22) Filed: Jul. 12, 2007

(65) Prior Publication Data
US 2008/0150848 A1 Jun. 26, 2008

(30) Foreign Application Priority Data

Dec. 26, 2006 (KR) .................. 10-2006-0134081

(51) Int. Cl.
*G06F 3/042* (2006.01)
*G09G 5/00* (2006.01)
*G09G 3/32* (2006.01)
*H01L 27/32* (2006.01)
*G06F 3/041* (2006.01)
*H01L 27/28* (2006.01)

(52) U.S. Cl.
CPC ............ *G09G 3/3233* (2013.01); *H01L 27/288* (2013.01); *G06F 3/042* (2013.01); *G06F 2203/04109* (2013.01); *H01L 27/323* (2013.01); *G09G 3/3291* (2013.01); *G06F 3/0412* (2013.01)
USPC ............................................ 345/176; 345/156

(58) Field of Classification Search
CPC ............................. G06F 3/042; G06F 3/0421
USPC ................................... 345/156, 176, 177
See application file for complete search history.

(56) References Cited

U.S. PATENT DOCUMENTS

| 7,166,966 B2* | 1/2007 | Naugler et al. ............ 315/149 |
| 2003/0052324 A1* | 3/2003 | Kimura ....................... 257/83 |
| 2004/0169625 A1 | 9/2004 | Park |
| 2004/0252091 A1 | 12/2004 | Ma et al. |
| 2004/0262614 A1* | 12/2004 | Hack et al. ................... 257/79 |
| 2005/0200293 A1 | 9/2005 | Naugler, Jr. et al. |
| 2005/0247936 A1 | 11/2005 | Bae et al. |

(Continued)

FOREIGN PATENT DOCUMENTS

| CN | 1506727 A | 6/2004 |
| CN | 1525223 A | 9/2004 |

(Continued)

OTHER PUBLICATIONS

Office Action dated Sep. 1, 2013 from the Korean Office Action in counterpart Korean application No. 10-2007-0056524.
Office Action dated Mar. 7, 2014 from the Korean Office Action in counterpart Korean application No. 10-2007-0056524.

*Primary Examiner* — Jonathan Horner
(74) *Attorney, Agent, or Firm* — Morgan, Lewis & Bockius LLP

(57) ABSTRACT

A display device includes a waveguide with a light propagating therein, and a panel including a first organic light-emitting device in a sub-pixel region and a second organic light-emitting device in a sensing region adjacent to the sub-pixel region, the first organic light-emitting device for displaying a data on the panel, and the second light-emitting device responsive to a scattering of the light from the waveguide for outputting a signal indicative of a contact on the waveguide.

9 Claims, 7 Drawing Sheets

(56) References Cited

U.S. PATENT DOCUMENTS

2006/0033016 A1 2/2006 Ogawa et al.
2006/0180890 A1* 8/2006 Naugler et al. ............... 257/444
2006/0279558 A1 12/2006 Van Delden et al.
2008/0121442 A1* 5/2008 Boer et al. ................. 178/18.09

FOREIGN PATENT DOCUMENTS

| CN | 1675580 A | 9/2005 |
| KR | 10-2005-0107840 A | 11/2005 |
| KR | 10-2006-0049286 A | 5/2006 |
| WO | 2004019119 A1 | 3/2004 |

* cited by examiner

ORGANIC LIGHT-EMITTING DIODE PANEL AND TOUCH-SCREEN SYSTEM INCLUDING THE SAME

This application claims priority to and the benefit of Korea Patent Application No. 10-2006-0134081 filed on Dec. 26, 2006, which is hereby incorporated herein by reference in its entirety.

BACKGROUND OF THE INVENTION

1. Field of the Invention

Embodiments of the present invention relate to a display panel, and more particularly to an organic light-emitting diode (OLED) panel capable of recognizing touching of the display panel.

2. Description of the Related Art

The importance of flat panel displays has recently increased with the growth of multimedia. Various types of flat panel displays such as liquid crystal displays (LCDs), plasma display panels (PDPs), field emission displays (FEDs), organic light-emitting devices have been put to practical use.

The small-sized flat panel displays providing a large number of functions have been frequently used in conjunction with touch-screens. The related art touch-screen was manufactured in the form of a separate device attached to the surface of a display panel using a mechanical mounting device.

However, mechanical mounting of the touch-screen to the display panel increases the number of parts, weight, manufacturing cost, and thickness of the flat panel display. Moreover, such related art touch-screen display devices do not accurately sense touching-positions in a multi-touch operation where the display device is touched at a plurality of locations concurrently.

SUMMARY OF THE INVENTION

Accordingly, embodiments of the present invention are directed to an organic light-emitting diode panel and a touch-screen using the same that substantially obviate one or more of the problems due to limitations and disadvantages of the related art, and a liquid crystal display device using the same.

An object of the present invention to provide an organic light-emitting diode panel having a multi-touch recognition capability.

Another object of the present invention is to provide a touch-screen system having a reduced number of mechanically attached parts.

Another object of the present invention is to provide a touch-screen system that is light and thin.

Another object of the present invention is to provide a touch-screen system

Additional features and advantages of the invention will be set forth in the description of exemplary embodiments which follows, and in part will be apparent from the description of the exemplary embodiments, or may be learned by practice of the exemplary embodiments of the invention. These and other advantages of the invention will be realized and attained by the structure particularly pointed out in the written description of the exemplary embodiments and claims hereof as well as the appended drawings.

To achieve these and other advantages and in accordance with the purpose of the present invention, as embodied and broadly described, a display device includes a waveguide with a light propagating therein, and a panel including a first organic light-emitting device in a sub-pixel region and a second organic light-emitting device in a sensing region adjacent to the sub-pixel region, the first organic light-emitting device for displaying a data on the panel, and the second light-emitting device responsive to a scattering of the light from the waveguide for outputting a signal indicative of a contact on the waveguide.

In another embodiment, an organic light emitting diode panel includes first and second substrates facing each other, thin film transistors on the first substrate, a display unit on the second substrate, the display having a plurality of sub-pixels and organic light emitting diode sensors, each sub-pixel and each organic light emitting diode sensors including first and second electrodes and an organic layer, a waveguide over the display unit, and a light source providing light into the waveguide.

In another embodiment, touch screen system includes a waveguide with a light substantially totally reflected therein, and a panel coupled to the waveguide, the panel including a plurality of light emitting-devices in a plurality of sensing regions adjacent to corresponding sub-pixel regions, the plurality of the light-emitting devices responsive to light scattering from the waveguide for outputting leakage currents indicative of a plurality of contacts on the waveguide, and a processor for calculating the locations of the contacts on the waveguide.

In a further embodiment, a method of recognizing touching on a display panel including a light emitting-device in a sensing region adjacent to a sub-pixel region and a waveguide attached thereon, the method includes propagating a light within the waveguide, applying a reverse bias to the sensing region, and detecting a leakage current from the light-emitting device produced by a scattering of the light from the waveguide in response to a contact on the waveguide.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are comprised to provide a further understanding of the invention and are incorporated in and constitute a part of this specification, illustrate embodiments of the invention and together with the description serve to explain the principles of the invention. In the drawings.

DETAILED DESCRIPTION OF EXEMPLARY EMBODIMENTS

Reference will now be made in detail to exemplary embodiments of the present invention, which are illustrated in the accompanying drawings. Wherever possible, the same reference numbers will be used throughout the drawings to refer to the same or like parts.

Figure 1:
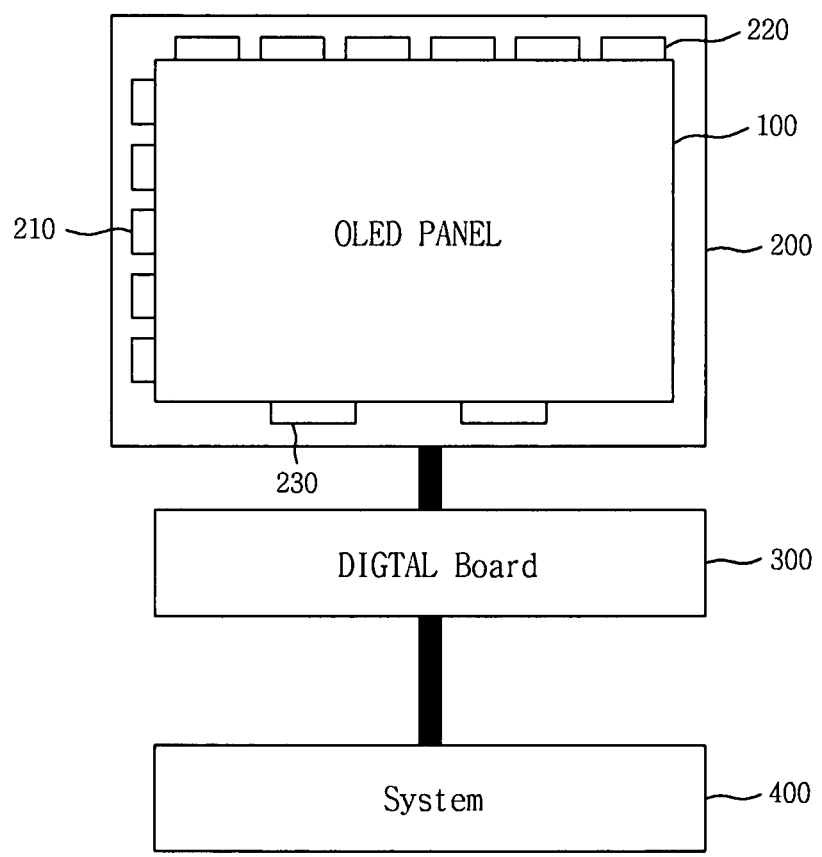
FIG. 1 is a block diagram representation of an exemplary touch-screen system incorporating an OLED panel according to an embodiment of the present invention.

FIG. 1 is a block diagram representation of an exemplary touch-screen system incorporating an OLED panel according to an embodiment of the present invention. Referring to FIG. 1, a touch-screen system according to an embodiment includes an OLED module 200, which includes an OLED panel 100, a digital board 300, and a system 400.

The OLED panel 100 includes a display part which includes a plurality of sub-pixels and a plurality of OLED sensors. A waveguide and a light source are positioned over the display part.

The OLED panel 100 is connected to a scan driver 210, a data driver 220, and a readout integrated circuit (IC) 230. The scan driver 210 and the data driver 220 apply driving signals to the OLED panel 100. The readout IC 230 measures a photo current generated in the OLED sensor of the OLED panel 100. In other words, the OLED module 200 includes the OLED panel 100, the scan driver 210, the data driver 220, and the readout IC 230.

The digital board 300 is connected to the OLED module 200. The digital board 300 may comprise a timing controller, an analog to digital converter (ADC) for processing a signal output to the readout IC 230, and a display signal processor (DSP). The timing controller generates control signals for controlling the scan driver 210 and the data driver 220.

The digital board 300 is connected to the system 400 such as a computer. A signal passing through the display signal processor of the digital board 300 is transmitted to the system 400 through a system interface, and the system 400 performs an operation corresponding to the transmitted signal.

Figure 2:
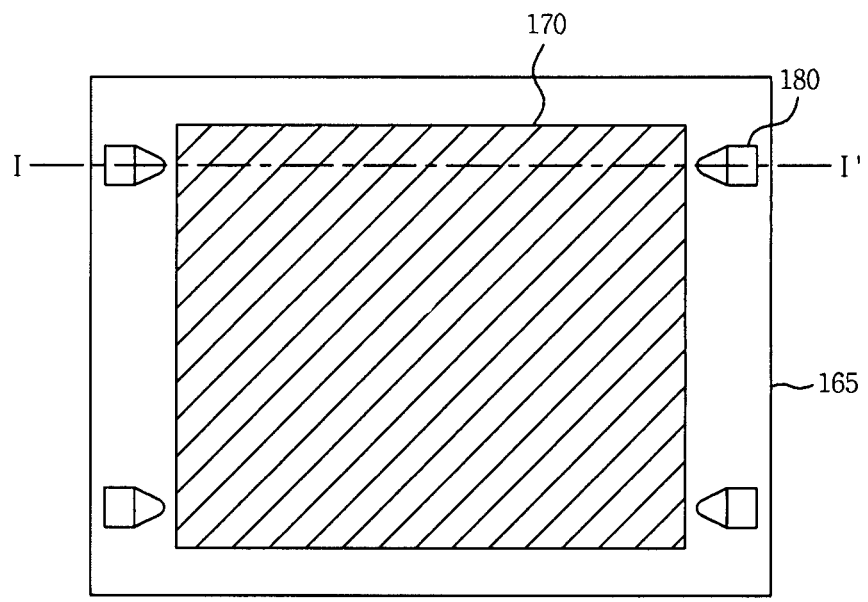
FIG. 2 is a plane view of an exemplary OLED panel according to an embodiment of the invention.
Figure 3:
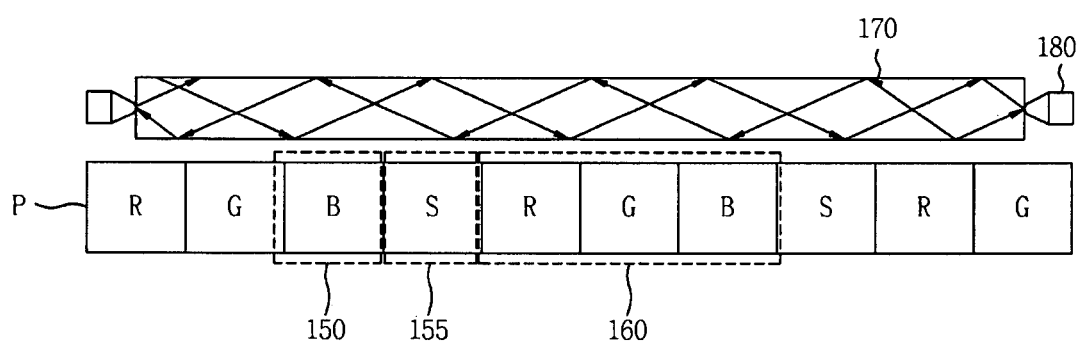
FIG. 3 is a cross-sectional view taken along line I-I' of the exemplary OLED panel of FIG. 2.

FIG. 2 is a plane view of an exemplary OLED panel according to an embodiment of the invention. FIG. 3 is a cross-sectional view taken along line I-I' of the exemplary OLED panel of FIG. 2. Referring to FIGS. 2 and 3, the OLED panel 100 includes a display P, a waveguide 170 positioned over the display P, and a light source 180 positioned at an edge of the waveguide 170.

The display P includes a plurality of sub-pixels 150 and a plurality of OLED sensors (S) 155. In FIG. 3, the OLED sensors 155 are positioned between pixels 160 each including red (R), greed (G), and blue (B) sub-pixels 150. However, the configuration of the pixel 160 or the OLED sensor 155 is not limited thereto. The pixel 160 or the OLED sensor 155 may be formed in other forms depending on the color gamut or the sensing level. In an embodiment, the pixel 160 may include a white sub-pixel in addition to the red (R), greed (G), and blue (B) sub-pixels 150. In another embodiment, each pixel 160 may at least two of the red (R), greed (G), blue (B), white sub-pixels.

The waveguide 170 is positioned on the upper portion of the display P. The waveguide 170 may be formed of glass or plastic with high transmissivity. The light source 180 is positioned at an edge of the waveguide 170. Although FIG. 2 has illustrated four light sources 180 positioned at four edges of the waveguide 170, the light source 180 is not limited thereto. If necessary, the number of light sources or the positions of the light sources may vary.

The light source 180 may be a light-emitting diode (LED). Light generated in the light source 180 enters the waveguide 170 through the side surface of the waveguide 170. The light enters in a direction perpendicular to the side surface of the waveguide 170. The light is totally reflected inside the waveguide 170, and stays inside the waveguide 170.

When the waveguide 170 is contacted by a material each having a different refractive index from the waveguide 170, the waveguide 170 may need be spaced apart from the display P using a mechanical device because of the break of the total reflection inside the waveguide 170.

If the waveguide 170 and the display P are formed of materials having a substantially equal refractive index, total reflection can be maintained inside the waveguide 170 even when the waveguide touches the display P. For example, a substrate positioned on an uppermost portion of the display P can to be formed of a material with a refractive index substantially equal to the refractive index of the material used in the waveguide 170.

Figure 4:
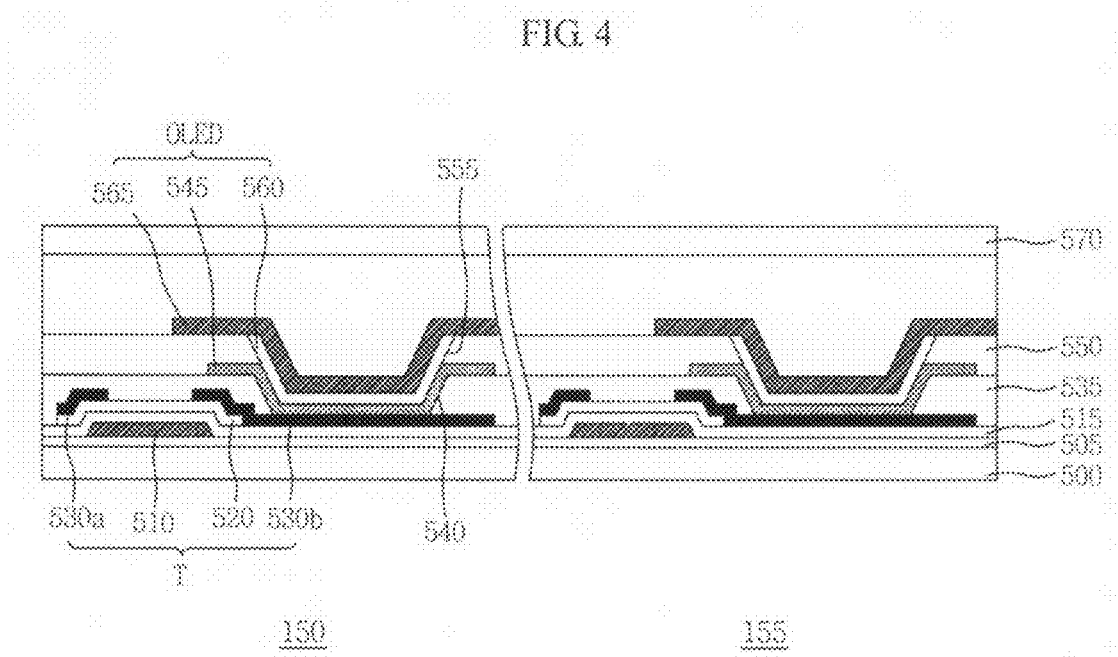
FIG. 4 is a cross-sectional view of a first exemplary structure of a sub-pixel and an OLED sensor in an OLED panel according to an embodiment of the invention.
Figure 5:
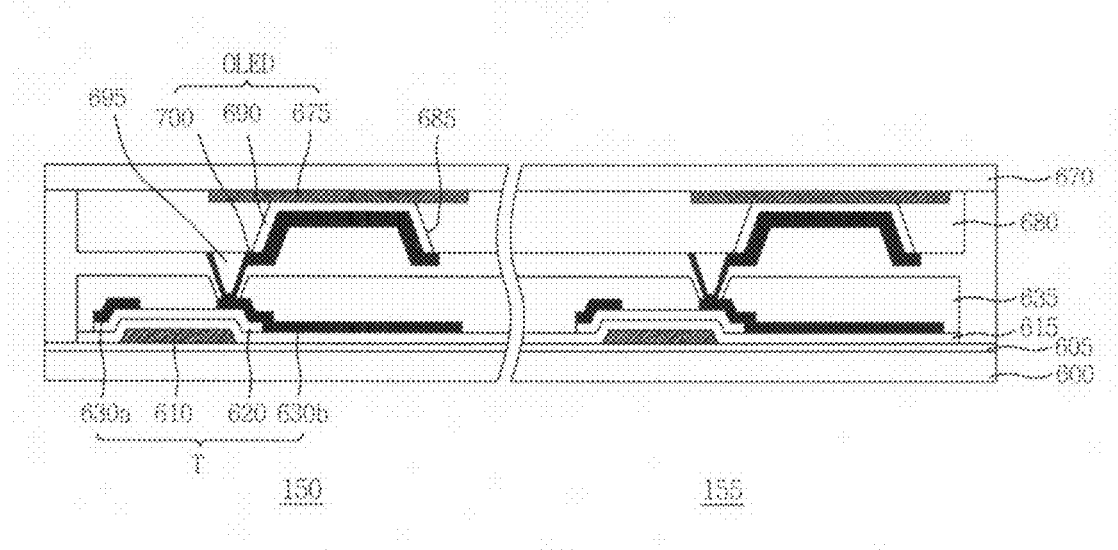
FIG. 5 is a cross-sectional view of a second exemplary structure of a sub-pixel and an OLED sensor in an OLED panel according to another embodiment of the invention.

FIG. 4 is a cross-sectional view of a first exemplary structure of a sub-pixel and an OLED sensor in an OLED panel according to an embodiment of the invention. FIG. 5 is a cross-sectional view of a second exemplary structure of a sub-pixel and an OLED sensor in an OLED panel according to another embodiment of the invention. Referring to FIG. 4, the sub-pixel 150 includes a thin film transistor (T) positioned on a first substrate 500 and a light-emitting diode (OLED) electrically connected to the thin film transistor (T).

More specifically, a buffer layer 505 is positioned on the first substrate 500 including glass, plastic or metal. A gate electrode 510 and a semiconductor layer 520 corresponding to a portion of the gate electrode 510 are positioned on the buffer layer 505. The semiconductor layer 520 may include amorphous silicon or polysilicon. Although not shown, an ohmic contact layer may be positioned on the semiconductor layer 520. A gate dielectric layer 515 is positioned between the gate electrode 510 and the semiconductor layer 520. A source electrode 530a and a drain electrode 530b are positioned on a portion of the semiconductor layer 520.

A passivation layer 535 is positioned on the first substrate 500 including the source electrode 530a and the drain electrode 530b. The passivation layer 535 includes a via hole 540 for exposing a portion of the drain electrode 530b.

A first electrode 545 is positioned on the first substrate 500 including the passivation layer 535. The first electrode 545 is electrically connected to the drain electrode 530b through the via hole 540.

A bank layer 550 is positioned on the first substrate 500 including the first electrode 545. The bank layer 550 includes an opening 555 exposing a portion of the first electrode 545.

An emitting layer 560 is positioned inside the opening 555 of the bank layer 550. The emitting layer 560 may include an organic material. The emitting layer 560 performs light-emission by receiving an electron and a hole and then forming an exciton. Although not shown, a hole injecting/transporting layer and an electron injecting/transporting layer for efficiently transporting electrons and holes may be further positioned on upper and lower portions of the emitting layer 560, respectively.

The emitting layer 560 may be formed by doping a guest material on a host material. Each sub-pixel 150 can emit red (R) light, green (G) light or blue (B) light depending on a material used in the emitting layer 560. A second electrode 565 is positioned on the emitting layer 560.

The first electrode 545 may be a cathode for supplying electrons to the emitting layer 560, and can be made of a metal, such as aluminum (Al) or magnesium (Mg) having a low work function and high reflectivity. The second electrode 565 may be an anode for supplying holes to the emitting layer 560, and can be made of a conductive metal, such as transparent indium-tin-oxide (ITO) having a high work function.

The first electrode 545 of each sub-pixel 150 and the first electrode 545 of each OLED sensor 155 are positioned to be spaced apart from each other. The second electrode 565 of each sub-pixel 150 and the second electrode 565 of each OLED sensor 155 are patterned to be spaced apart from each other.

This is to apply voltages of different polarities to the sub-pixel 150 and the OLED sensor 155. The second electrode 565 of the sub-pixel 150 may be formed of a common electrode, which is patterned to be spaced apart from the second electrode 565 of the OLED sensor 155.

The first substrate 500, on which the thin film transistor (T) and the light-emitting diode (OLED) are positioned, is attached to a second substrate 570 to protect the thin film transistor (T) and the light-emitting diode (OLED) from the outside air.

The sub-pixel 150 may have a different structure from the structure illustrated in FIG. 4.

Referring to FIG. 5, a buffer layer 605 is positioned on a first substrate 600, and a thin film transistor (T) is positioned on the buffer layer 605. The thin film transistor (T) includes a gate electrode 610, a semiconductor layer 620 corresponding to a portion of the gate electrode 610, a gate dielectric layer 615 positioned between the gate electrode 610 and the semiconductor layer 620, and a source electrode 630a and a drain electrode 630b positioned on a portion of the semiconductor layer 620. A passivation layer 635 is positioned on the thin film transistor (T) to expose the drain electrode 630b.

An OLED is positioned on a second substrate 670. More specifically, a first electrode 675 is positioned on the second substrate 670. The first electrode 675 may be a common electrode formed on a front surface of the second substrate 670. A bank layer 680 is positioned on the second substrate 670 including the first electrode 675. The bank layer 680 includes an opening 685 exposing a portion of the first electrode 675. An emitting layer 690 is positioned inside the opening 685. A contact spacer 695 is positioned in a portion of the bank layer 680 spaced apart from the opening 685. A second electrode 700 is positioned on the contact spacer 695 and the emitting layer 690.

The first substrate 600, on which the thin film transistor (T) is formed, is attached to the second substrate 670, on which the light-emitting diode (OLED) is formed, with a sealant. The thin film transistor (T) is electrically connected to the light-emitting diode (OLED) through the contact spacer 695.

An organic light-emitting display including the OLED panel according to an embodiment is a top-emission type organic light-emitting display. In other words, the first electrode 675 may be a transparent electrode, and the second electrode 700 may be a reflective electrode. For example, the first electrode 675 may include a transparent conductive layer and be an anode with a high work function. The second electrode 700 may be a cathode including a metal with a low work function.

The first electrode 675 of each sub-pixel 150 and the first electrode 675 of each OLED sensor 155 are positioned to be spaced apart from each other so that the first electrode 675 of each sub-pixel 150 is electrically insulated from the first electrode 675 of each OLED sensor 155. The second electrode 700 of each sub-pixel 150 and the second electrode 700 of each OLED sensor 155 are patterned to be spaced apart from each other. This is to apply voltages of different polarities to the sub-pixel 150 and the OLED sensor 155. The first electrode 675 of the sub-pixel 150 may be formed of a common electrode, which is patterned to be spaced apart from the first electrode 675 of the OLED sensor 155, for simplification of interconnection processes.

Figure 6:
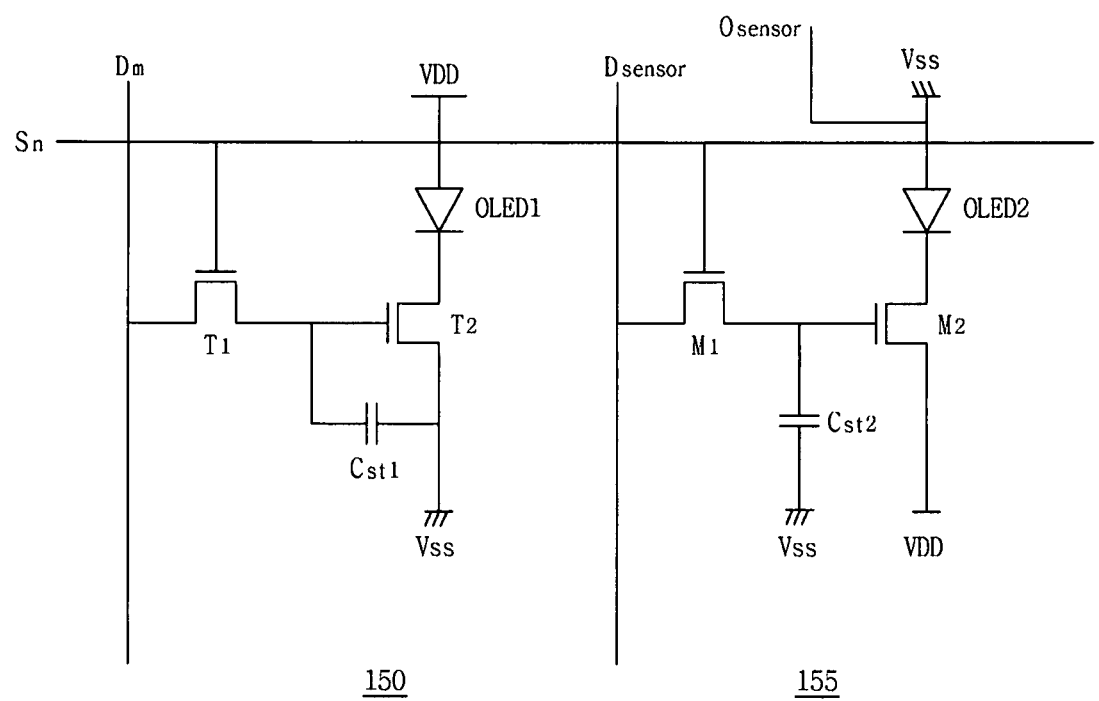
FIG. 6 is an exemplary circuit diagram of the sub-pixel and the OLED sensor in the OLED panel according to an embodiment of the invention.

FIG. 6 is an exemplary circuit diagram of the sub-pixel and the OLED sensor in the OLED panel according to an embodiment of the invention. Referring to FIG. 6, the sub-pixel 150 of the OLED panel includes a switching transistor Ti, a capacitor Cst1, a driving transistor T2, and a light-emitting diode OLED1. The switching transistor T1 receives a scan signal from a scan line (Sn), and transmits a data signal received from a data line Dm. The capacitor Cst1 receives the transmitted data signal and stores it. The driving transistor T2 generates a driving current corresponding to a difference between the data signal stored in the capacitor Cst1 and a reference voltage Vss. The light-emitting diode OLED1 emits light corresponding to the driving current. A first electrode of the light-emitting diode OLED1 is connected to a source voltage VDD, and a second electrode of the light-emitting diode OLED1 is connected to the reference voltage Vss. Therefore, the sub-pixel emits light of various gray levels depending on a magnitude of the data signal.

The OLED sensor 155 includes a switching transistor M1, a capacitor Cst2, a driving transistor M2, and a light-emitting diode OLED2. The switching transistor M1 receives a scan signal from the scan line (Sn), and transmits a data signal received from a data line $D_{sensor}$. The capacitor Cst2 receives the transmitted data signal and stores it. The driving transistor M2 is turned on by the data signal stored in the capacitor Cst2. A first electrode of the light-emitting diode OLED2 is connected to a source voltage VDD, and a second electrode of the light-emitting diode OLED2 is connected to the reference voltage Vss.

The sub-pixel 150 and the OLED sensor 155 can be formed by the same fabrication processes except for that the second electrode of the sub-pixel 150 and the second electrode of the OLED sensor 155 are formed to be spaced apart from each other. In other words, in the OLED panel according to an embodiment, the sub-pixel 150 for achieving an image and the OLED sensor 155 for touch sensing are concurrently formed in an array form on the same plane. Accordingly, the OLED panel according to an embodiment is manufactured to be light and thin at low manufacturing cost while including a touch sensing function. Further, since the sub-pixel 150 and the OLED sensor 155 are formed in an array form over the entire surface of the OLED panel according to an embodiment, it is possible to sense several touch positions. In other words, multi-touch sensing is possible.

Figure 7:
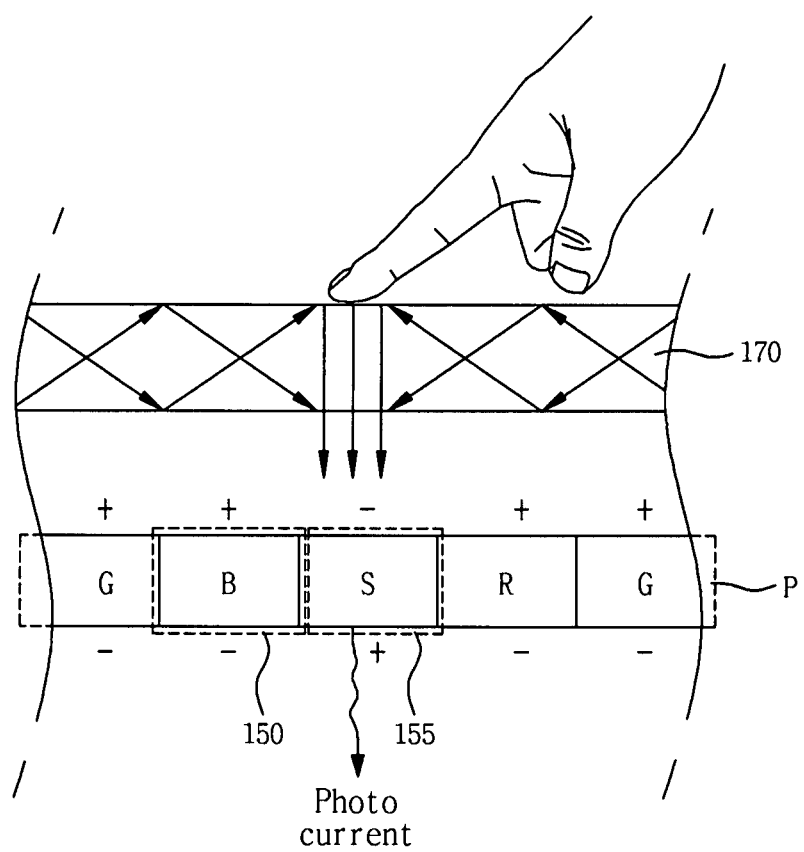
FIG. 7 is a schematic cross-sectional view of a touch detection operation of the OLED panel according to an embodiment of the invention.

FIG. 7 is a schematic cross-sectional view of a touch detection operation of the OLED panel according to an embodiment of the invention. Referring to FIGS. 6 and 7, when light enters the waveguide 170 by turning on the light source 180 (shown in FIG. 3), the light entering the waveguide 170 is substantially totally reflected and stays inside the waveguide 170.

The switching transistor T1 of the sub-pixel 150 is turned on by applying a scan signal to the scan line Sn such that a data signal is applied through the data line Dm of the sub-pixel 150. The capacitor Cst1 stores the data signal. The driving transistor T2 generates a driving current corresponding to a difference between the data signal stored in the capacitor Cst1 and the reference voltage Vss, and transmits the driving current to the light-emitting diode OLED1. Since a positive bias is applied to the sub-pixel 150, the light-emitting diode OLED1 emits light corresponding to the driving current. The display P displays an image corresponding to the data signal.

The switching transistor M1 of the OLED sensor 155 is turned on by applying a scan signal to the scan line Sn such that a data signal is applied through the data line $D_{sensor}$ of the OLED sensor 155. The capacitor Cst2 stores the data signal. The driving transistor M2 is turned on by the data signal stored in the capacitor Cst2 such that the first electrode of the light-emitting diode OLED2 is connected to the reference voltage Vss. Since a reverse bias is applied to the OLED sensor 155, a current does not flow in the OLED sensor 155.

In an embodiment, when the user touches the waveguide 170, totally reflected light in the predetermined position is scattered in a rear surface of the waveguide 170. This phenomenon is called frustrated total internal reflection (FTIR). Accordingly, when light is totally reflected in a first medium, the light will be scattered when the first medium comes into contact with a second medium having a different refractive index. The OLED panel according to an embodiment uses FTIR. In other words, the OLED sensor 155 senses light scattered by FTIR when the user touches the waveguide 170.

The light is scattered at the position touched by the user and enters the OLED sensor 155 to which the reverse bias is applied. The light entering the OLED sensor 155 having light receiving characteristics generates a free electrons and holes inside the emitting layer. Accordingly, the scattered light entering the OLED sensor 155 at the touch position causes a leakage current, i.e., a photo current to flow in the OLED sensor 155. The amount of the leakage current depends on the amount of light entering the OLED sensor 155 at the touch position.

The photo current is transmitted to the digital board 300 through an output line $O_{sensor}$ of the OLED sensor 155 of FIG. 6 and the readout IC 230 of FIG. 1. The digital board 300 processes the photo current, and then transmits the processed photo current to the system 400. The system 400 performs an operation corresponding to the applied signal.

As described above, the OLED panel according to an embodiment drives the sub-pixel 150 and the OLED sensor 155 using the same driving method, thereby simultaneously performing the image display and the touch sensing. Accordingly, since the OLED panel does not have a separate driving circuit of the OLED sensor 155 for touch sensing, the OLED panel is manufactured by the simple manufacturing processes at low cost.

Figure 8:
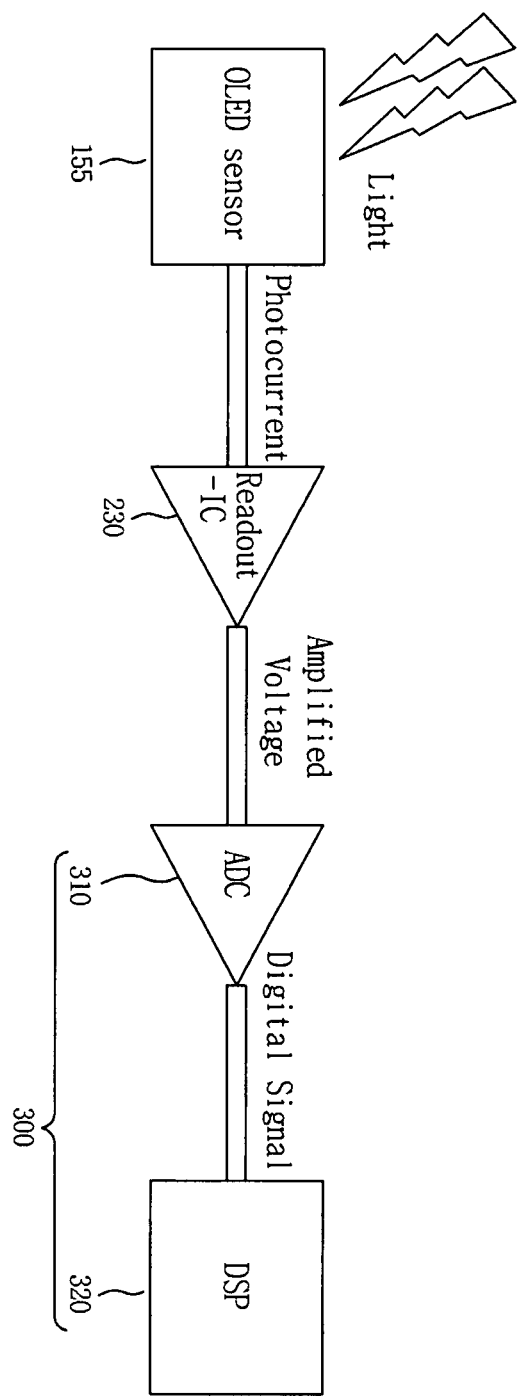
FIG. 8 is a diagram illustrating an exemplary signal processing of a photo current generated in the OLED sensor of the OLED panel according to an embodiment of the invention.

FIG. 8 is a diagram illustrating an exemplary signal processing of a photo current generated in the OLED sensor of the OLED panel according to an embodiment of the invention. Referring to FIG. 8, a photo current generated in the OLED sensor 155 is output to the readout IC 230. The readout IC 230 converts the photo current into a voltage, amplifies the voltage, and supplies the amplified voltage to an analog to digital converter (ADC) 310 positioned on the digital board 300 of FIG. 1. The ADC 310 converts the supplied voltage into a digital signal, and then transmits the digital signal to a display signal processor 320.

Figure 9:
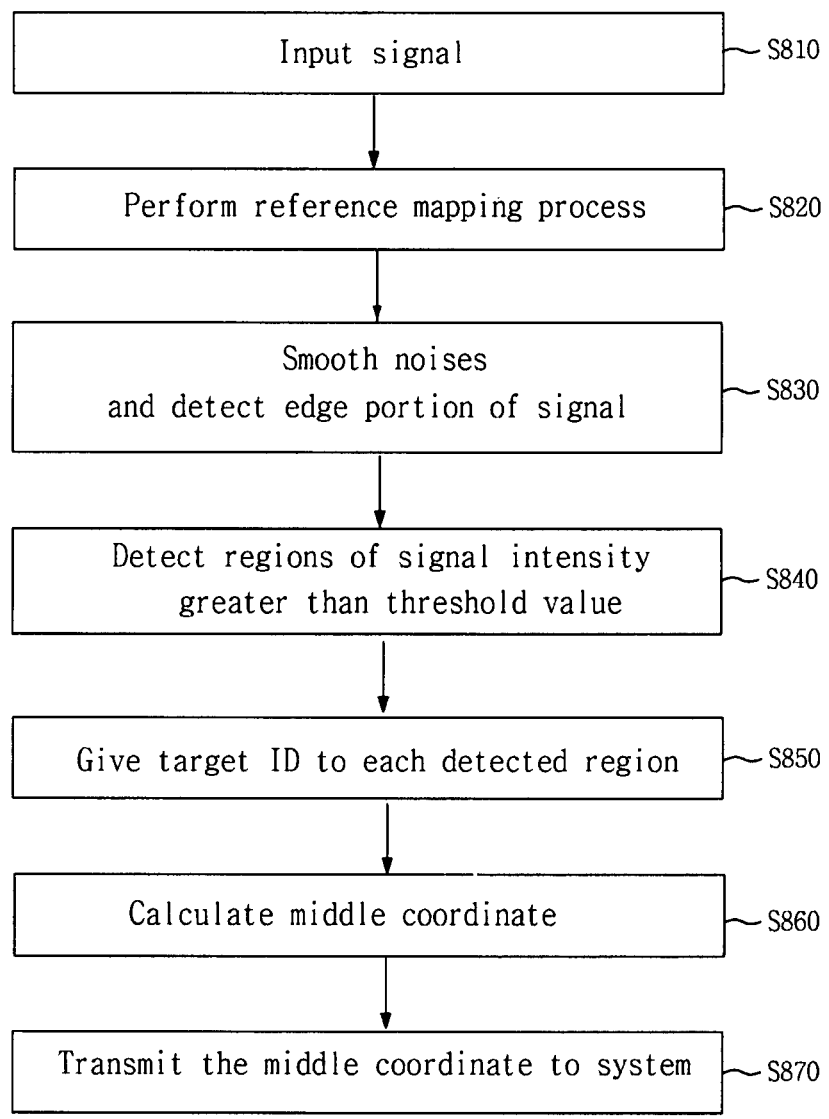
FIG. 9 is a flow chart illustrating an exemplary signal processing in a display signal processor.

FIG. 9 is a flow chart illustrating an exemplary signal processing in a display signal processor. Referring to FIG. 9, a signal is input to the display signal processor 320 in step S810. The display signal processor 320 performs a reference mapping process on the input signal in step S820.

The reference mapping process corrects the input signals to adjust a characteristic of each OLED sensor 155 because each OLED sensor 155 of the OLED panel has different noise characteristics.

Next, the display signal processor 320 smoothes noises of the corrected signals, and clearly defines boundaries of the signals by detecting edge portions of the signals in step S830.

Since the OLED sensors and the sub-pixels are arranged in an array form, the OLED sensor recognizes signals not in coordinate information but in image form information. Accordingly, the above process is performed to analyze a pattern of the image information. Since the signal is recognized not in coordinate information but in image form information, the OLED panel can perform multi-touch sensing.

The display signal processor 320 detects regions of signal intensity greater than a threshold value, and determines the detected regions as touch positions in step S840.

In other words, since a photo current is likely to be partially generated by user's hand shape as well as user's finger, regions whose signal intensity is greater than the threshold value are detected and the detected regions are determined as touch positions.

The display signal processor 320 gives a target identification (ID) to each of the detected regions in step S850.

The display signal processor 320 calculates middle coordinates of each region in step S860. The display signal processor 320 transmits the calculated middle coordinates to the system 400 in step S870. The system 400 performs an operation corresponding to the transmitted middle coordinates.

As described above, in the OLED panel according to an embodiment and the touch-screen system including the OLED panel, the sub-pixel and the OLED sensor are simultaneously formed in the array form using light receiving characteristics of the OLED sensor. Accordingly, the thin and light flat panel displays can be achieved, and manufacturing yield can improve due to a reduction in time and cost.

Further, since the OLED sensor is arranged in the array form, the OLED sensor receives touch information of an image form. Therefore, multi-touch sensing can be performed.

The OLED panel according to an embodiment and the touch-screen system are manufactured to be light and thin while reducing time and cost. Further, multi-touch sensing is possible.

It will be apparent to those skilled in the art that various modifications and variations can be made in embodiments of the present invention. Thus, it is intended that embodiments of the present invention cover the modifications and variations of the embodiments described herein provided they come within the scope of the appended claims and their equivalents.

What is claimed is:

1. A display device, comprising:
  a waveguide with a light propagating therein;
  at least one light source located at edges of the waveguide to emit the light to the waveguide; and
  a panel including a first organic light-emitting device in a sub-pixel region and a second organic light-emitting device in a sensing region adjacent to the sub-pixel region, the first organic light-emitting device for displaying a data on the panel, and the second organic light-emitting device responsive to a scattering of the light from the waveguide for outputting a signal indicative of a contact on the waveguide,
  wherein the sub-pixel region includes a first switching transistor which is configured to receive a scan signal from a scan line and transmit a first data signal received from a data line, a first capacitor which is configured to store the first data signal, a first driving transistor which is configured to generate a driving current corresponding to a difference between the first data signal stored in the first capacitor and a reference voltage, and the first organic light emitting device having a first electrode connected to the reference voltage and a second electrode connected to a source voltage to emit light corresponding to the driving current, wherein the sensing region includes a second switching transistor which is configured to receive the scan signal from the scan line and transmit a second data signal received from a data line, a second capacitor which is configured to store the second data signal, a second driving transistor which is configured to be turned on by the second data signal stored in the second capacitor, and the second organic light emitting device having a first electrode connected to the source voltage, and a second electrode connected to the reference voltage, and wherein the first and second organic light-emitting devices are separated from each other and included in an array of organic light-emitting device disposed on a same plane.

2. The display device of claim 1, wherein the signal from the second organic light-emitting device includes a photo current.

3. The display device of claim 1, wherein the waveguide and a portion of the panel facing the waveguide have substantially the same refractive index.

4. The display device of claim 3, wherein the waveguide and the panel are separated from each other.

5. The display device of claim 1, further comprising a processor for calculating a location of the contact on the waveguide.

6. A touch screen system, comprising:
a waveguide with a light substantially totally reflected therein;
at least one light source located at edges of the waveguide to provide the light to the waveguide;
a panel coupled to the waveguide, the panel including a plurality of first organic light emitting devices in a plurality of sub-pixel regions, and a plurality of second organic light emitting devices in a plurality of sensing regions adjacent to corresponding respective ones of the sub-pixel regions, the plurality of the second organic light emitting devices responsive to light scattering from the waveguide for outputting leakage currents indicative of a plurality of contacts on the waveguide, wherein the plurality of first organic light emitting devices and the plurality of second organic light emitting devices are separated from each other and disposed in a same plane; and a processor for calculating the locations of the contacts on the waveguide, wherein each sub-pixel region includes a first switching transistor which is configured to receive a scan signal from a scan line and transmit a first data signal received from a data line, a first capacitor which is configured to store the first data signal, a first driving transistor which is configured to generate a driving current corresponding to a difference between the first data signal stored in the first capacitor and a reference voltage, and a respective one of the first organic light emitting devices having a first electrode connected to the reference voltage and a second electrode connected to a source voltage to emit light corresponding to the driving current, and wherein each sensing region includes a second switching transistor which is configured to receive the scan signal from the scan line and transmit a second data signal received from a data line, a second capacitor which is configured to store the second data signal, a second driving transistor which is configured to be turned on by the second data signal stored in the second capacitor, and a respective one of the second organic light emitting devices having a first electrode connected to the source voltage, and a second electrode connected to the reference voltage.

7. The touch screen system of claim 6, wherein the waveguide and a portion of the panel facing the waveguide have substantially the same refractive index.

8. The touch screen system of claim 7, wherein the waveguide and the panel are separated from each other.

9. The touch screen system of claim 6, further comprising;
a readout integrated circuit connected to the second organic light emitting devices;
a converter converting a signal from the readout integrated circuit; and
a video signal processor processing the converted signal from the readout integrated circuit.

* * * * *